United States Patent [19]

Blouse et al.

[11] Patent Number: 5,266,504
[45] Date of Patent: Nov. 30, 1993

[54] LOW TEMPERATURE EMITTER PROCESS FOR HIGH PERFORMANCE BIPOLAR DEVICES

[75] Inventors: Jeffrey L. Blouse, Stanfordville; Jack O. Chu, Long Island; Brian Cunningham, Highland, all of N.Y.; Jeffrey P. Gambino, Gaylordsville, Conn.; Louis L. Hsu, Fishkill, N.Y.; David E. Kotecki, Hopewell Junction, N.Y.; Seshadri Subbanna, Hopewell Junction, N.Y.; Zu-Jean Tien, Saratoga, Calif.

[73] Assignee: International Business Machines Corporation, Armonk, N.Y.

[21] Appl. No.: 857,862

[22] Filed: Mar. 26, 1992

[51] Int. Cl.$^5$ .................................... H01L 21/365
[52] U.S. Cl. .................................... 437/31; 437/101; 437/247; 437/83; 437/109; 148/DIG. 1; 148/DIG. 124
[58] Field of Search ............... 437/31, 162, 101, 247, 437/909, 83, 109; 148/DIG. 1, DIG. 11, DIG. 124

[56] References Cited

U.S. PATENT DOCUMENTS

| | | | |
|---|---|---|---|
| 3,900,345 | 8/1975 | Lesk | 148/1.5 |
| 4,523,370 | 6/1985 | Sullivan et al. | 29/576 B |
| 4,565,584 | 1/1986 | Tamura et al. | 148/1.5 |
| 4,597,160 | 7/1986 | Ipri | 29/571 |
| 4,651,410 | 3/1987 | Feygenson | 29/576 J |
| 4,789,644 | 12/1988 | Meda | 437/41 |
| 4,812,890 | 3/1989 | Feygenson | 357/34 |
| 4,814,292 | 3/1989 | Sasaki et al. | 437/247 |
| 4,853,342 | 8/1989 | Taka et al. | 437/31 |
| 4,977,098 | 12/1990 | Yu et al. | 437/162 |
| 5,108,936 | 4/1992 | Ghannam et al. | 148/DIG. 1 |

FOREIGN PATENT DOCUMENTS 048014 3/1987 Japan .
0076763 3/1989 Japan .

OTHER PUBLICATIONS

T. H. Ning, et al., "Self-Aligned Bipolar Transistors for High-Performance and Low-Power-Delay VLSI" IEEE Transactions on Electron Devices, vol. ED-28, No. 9, pp. 1010-1013 (Sep. 1981).

Y. Kunii, et al., "Solid-Phase Lateral Epitaxy of Chemic-Vapor-Deposited Amorphous Silicon by Furnace Annealing" J. Appl. Phys. 54 (5), pp. 2847-2849 (May 1983).

B. S. Meyerson, et al., "Low Temperature Silicon Epitaxy by Hot Wall Ultrahigh Vacuum/Low Pressure Chemical Vapor Deposition Techniques: Surface Optimization" J. Electrochem. Soc.: Solid-State Science and Technology, pp. 1232-1235 (Jun. 1986).

G. L. Patton, et al., "Silicon-Germanium-Base Heterojunction Bipolar Transistors by Molecular Beam Epitaxy" IEEE Electron Device Letters, vol. 9, No. 4, pp. 165-167 (Apr. 1988).

En-Jun Zhu, et al., "Amorphous Si/Si Heterojunction Microwave Transistors" IEEE Electron Device Letters, vol. 10, No. 1, p. 5 (Jan. 1989).

M. Kondo, et al., "An Ultra-High Emitter Efficiency Transistor with a Low-Temperature Processed Polysilicon Emitter for High-Speed Bipolar ULSIs" Semiconductor International, pp. 65-67 (Dec. 1991).

Primary Examiner—Brian E. Hearn
Assistant Examiner—Tuan Nguyen
Attorney, Agent, or Firm—Harold Huberfeld

[57] ABSTRACT

A method of manufacturing a bipolar transistor by use of low temperature emitter process is disclosed. After completion of the usual base and collector formation in a vertical bipolar transistor, an emitter opening is etched in the insulator layer over the base layer at selected locations. A thin layer (less than 500 Å) of in-situ doped amorphous silicon is deposited over the substrate and heated to densify for 30 to 60 minutes at about 650° C. Subsequently an in-situ doped polysilicon layer of 100 to 200 nm is deposited over the amorphous Si film preferably at about 600° C. Subsequently the layers are heated below 600° C. for several hours to convert partially the amorphous Si into a monocrystalline emitter layer over the base regions.

14 Claims, 4 Drawing Sheets

LOW TEMPERATURE EMITTER PROCESS FOR HIGH PERFORMANCE BIPOLAR DEVICES

FIELD OF INVENTION

The present invention is in the area of semiconductor manufacturing and specifically in the area of forming high performance bipolar devices using low temperature emitter processes.

BACKGROUND OF THE INVENTION

Bipolar transistors are extensively used for high speed switching in integrated circuits. To improve speed of the transistor, the device dimensions are being shrunk both horizontally and vertically. The vertical bipolar transistors, most commonly used in ICs, have vertically aligned emitter, base and collector regions (Ning et al., Self-Aligned Bipolar transistors for High Performance and Low power delay VLSI" IEEE Trans. Elec. Dev. ED-28, pps. 1010-1013, 1981). FIG. 1 shows a cross section of an NPN bipolar transistor with the collector 12, base 14 and emitter 16 on a substrate 10. Also shown in FIG. 1, are deep trench isolation 18, shallow trench isolation 20, extrinsic base 22, subcollector 24, collector reach-through 26, the base-collector junction 28 and the emitter-base junction 30. The emitter and the collector are doped with phosphorous or arsenic (N dopants) and the base is doped with boron (P type).

An important feature in a bipolar transistor is the characteristics of the emitter-base junction, which is the transition region in the silicon, where the high N dopant concentration of the emitter and the high P dopant concentration of the base cross over. A narrow emitter-base junction has been claimed to improve current gain of the transistor by improving the emitter injection efficiency (M. Kondo, M. Namba, T. Kobayashi, S. Iijima and T. Nakamura, VLSI 91 Proceedings, pps. 65-66). A narrow emitter-base junction is known to speed up the switching by reducing the base transit time and the emitter charge storage time.

Another important feature is the base-collector junction, which is the base to collector transition region. A third important feature is the width of the base layer, i.e, the P dopant region between the emitter and the collector.

The ability to control the junction profile allows one to control the base width predictably. The base width control is improved by the ability of the process to make abrupt emitter-base and base-collector junctions.

Another important consideration is low electrical contact resistance, especially since emitter dimensions are small. In the case of polysilicon emitters, the contact between polysilicon and the single crystal silicon defined by the emitter opening must preferably have low resistance.

It is well known from prior art that in the manufacture of bipolar devices, epitaxial deposition methods are used extensively to deposit monocrystalline layers that are defined to form sub-collector, collector and base regions. Also ion implantation and high temperature annealing are used to dope the base, extrinsic base, emitter and reach-through regions and to activate and control dopant profiles. These processes are not reviewed here in any detail. However, an aspect of semiconductor processing relevant to the present invention is the process of depositing amorphous and poly-Si and recrystallizing them by Solid Phase Epitaxy.

U.S. Pat. No. 4,565,584 to Tamura et al. shows a method of producing a single crystal film by first depositing a pattern of insulating material over a single crystal substrate. An amorphous or polycrystalline film is formed over both the insulator and exposed areas of the substrate. The structure is then annealed to convert the amorphous or polycrystalline film by solid phase epitaxy (SPE) into a monocrystalline structure.

Kunii, Y., et al., "Solid-Phase Lateral Epitaxy of Chemical-Vapor-Deposited Amorphous Silicon by Furnace Annealing", J. Appl. Phys., 54 (5), May 1983, pps. 2847-2850, shows a similar process for SPE growth of monocrystalline silicon over silicon/insulator using a two step anneal. A layer of amorphous silicon is first annealed at a temperature in the range of 550°-650° C. to effect crystalline growth, and second annealed in the range of about 1150° C. to reduce dislocations.

U.S. Pat. No. 3,900,345 to Lesk shows a process for forming thin epitaxial regions by first forming a layer of amorphous silicon over a layer of single crystal (i.e. monocrystalline) silicon. Ions are implanted to cause defects at the amorphous/monocrystalline interface and cause a more intimate contact. The structure is then annealed at a temperature in the range of 600°-900° C. to convert the amorphous silicon by SPE to single crystal silicon.

Japanese Patent No. 62-48014 by Sony Corp. shows a process wherein a thin film of polysilicon is formed over a monocrystalline silicon substrate. Ions are implanted to make the polycrystalline amorphous. A thicker layer of amorphous silicon is formed over the first layer. The structure is then subjected to a low temperature anneal (of about 600° C.) to convert the two layers of amorphous silicon by SPE to a thick layer of single crystal silicon.

The following patents show the use of SPE to form transistor device regions.

U.S. Pat. Nos. 4,812,890 and 4,651,410, both to Feygenson, show a method of forming a bipolar transistor wherein both the base and collector regions are formed by recrystallization (at about 800° C.) of polysilicon. The base and collector regions are separately doped, after each region is recrystallized, to the desired dopant concentration. The process suffers from several disadvantages. First, the recrystallization of polysilicon requires a relatively high-temperature anneal, sufficient to cause some undesirable dopant diffusion. Further, the doping of the base and collector regions after recrystallization provides a poor control on the dopant profiles and the characteristics of the junctions.

U.S. Pat. No. 4,853,342 to Taka et al. shows a method of forming a bipolar transistor wherein selective SPE of polysilicon is performed twice, once to form a collector region and once to form a base region. Each recrystallization is performed at a temperature of about 550° C. Multiple implants are performed prior to each recrystallization: to provide dopant impurities, and to "clean" the mono-polycrystalline interface. This method also suffers from the disadvantages of subsequent doping of the recrystallized regions results, discussed earlier.

U.S. Pat. No. 4,789,644 to Meda shows a process of forming an insulated gate field-effect transistor (IGFET) wherein polysilicon is deposited over single crystal silicon, ions are selectively implanted through the polysilicon and into the single crystal silicon so as to render the polysilicon amorphous. Recrystallization heat treatment is then performed at temperatures of between 450°-600° C. to recrystallize the implanted, amorphous silicon by SPE as single crystal silicon. These recrystallized regions comprise the source and drain, respectively, of the IGFET.

Zhu, E., "Amorphous Si/Si Heterojunction Microwave Transistors," IEEE Electron Device Letters, Vol 10, No. 1, January 1989, pps. 4–6, discusses the formation of a heterojunction bipolar transistor wherein low-temperature, plasma-enhanced chemical vapor deposition (PECVD) is used to form an amorphous silicon emitter. This process results in high emitter resistance.

Another example wherein low temperature processes are beneficially used is that of forming heterojunction bipolar transistors (HBT). For a description of an HBT, see Patton, G. L., et al., "Silicon-Germanium-Base Heterojunction Bipolar Transistors by Molecular Beam Epitaxy", IEEE Electron Device Letters, Vol. 9, No. 4, April 1988, pps. 165–167. In the above mentioned device, very thin base region is formed using molecular beam epitaxy (MBE) at temperatures below about 550° C. However, no practical, bulk manufacturing process is known using MBE base.

Processes for forming HBT transistors are known wherein ultra-thin base regions are formed using the ultrahigh vacuum chemical vapor deposition (UHV/CVD) process shown, for example, in Meyerson, B. S., et al. "Low Temperature Silicon Epitaxy by Hot Wall Ultrahigh Vacuum/Low pressure Chemical Vapor Deposition Techniques: Surface Optimization", J. Electrochem. Soc.: Solid-State Science and Technology, Vol. 133, No. 6, pps. 1232–1235. However, such processes have suggested the use of a higher temperature process to form the emitter region. Such a high temperature can cause boron diffusion leading to increase in base width. It can also cause dislocations to form in the strained Si-Ge layer, resulting in degradation of transistor characteristics and yield.

In fact, no acceptable process for bulk manufacturing transistors, particularly HBT transistors, is known to the present inventors which includes a low temperature process for forming the transistor emitter. As mentioned above, known processes which utilize UHV/CVD to form ultrathin base regions have utilized high temperature emitter fabrications. In specific, the low temperature used (less than 700° C.) in these processes are beneficial for fabricating very narrow base width (500 Å to 2000 Å) devices.

U.S. Pat. No. 4,523,370 issued to Sullivan and Collins, June 1985 claims process improvements to achieve narrow base widths and abrupt base-collector and base-emitter junctions. In his process, he deposits a polysilicon base layer with an in-situ doping at low temperature over the single crystal collector region, and converts the polycrystalline region to single crystal by annealing at about 1200° C. for 10 seconds, thereby converting the polycrystal into single crystal by solid phase epitaxy. This has been claimed to establish a sharp collector-base junction.

OBJECTS OF THE INVENTION

An object of the present invention is to achieve a well controlled, sharp emitter-base junction in a bipolar device.

Another object of the present invention is to achieve a well controlled narrow base width in a bipolar device.

Yet another object of the invention is to obtain a low emitter contact resistance and an emitter-base interface devoid of defects, voids etc.

A further object of the invention is to use low temperature processing to avoid dopant spreading in the device structure.

Yet another object is to use lower temperatures for processing to reduce dislocation generation and nucleation, which would cause yield loss due to emitter to collector shorts.

Another object of the present invention is to use low temperature emitter process to fabricate hetero-junction base devices.

Still another object of the invention is a process that is high yielding and manufacturable using currently known Integrated Circuit manufacturing methods.

SUMMARY OF THE INVENTION

A method of manufacturing a bipolar transistor by use of low temperature emitter process is disclosed. After completion of the usual base and collector formation in a vertical bipolar transistor, an emitter opening is etched in the insulator layer over the base layer at selected locations. A thin layer (less than 500 Å) of in-situ doped amorphous silicon is deposited over the substrate and heated to densify for 30 to 60 minutes at about 650° C. Subsequently an in-situ doped polysilicon layer of 100 to 200 nm is deposited over the amorphous Si film preferably at about 600° C. Subsequently the layers are heated below 600° C. for several hours to convert partially the amorphous Si into a monocrystalline emitter layer over the base regions.

BRIEF DESCRIPTION OF THE DRAWINGS

The objects, features and advantages of the invention will be apparent from the following more particular description of the invention illustrated in the accompanying drawings, in which.

DETAILED DESCRIPTION OF THE INVENTION

Figure 1:
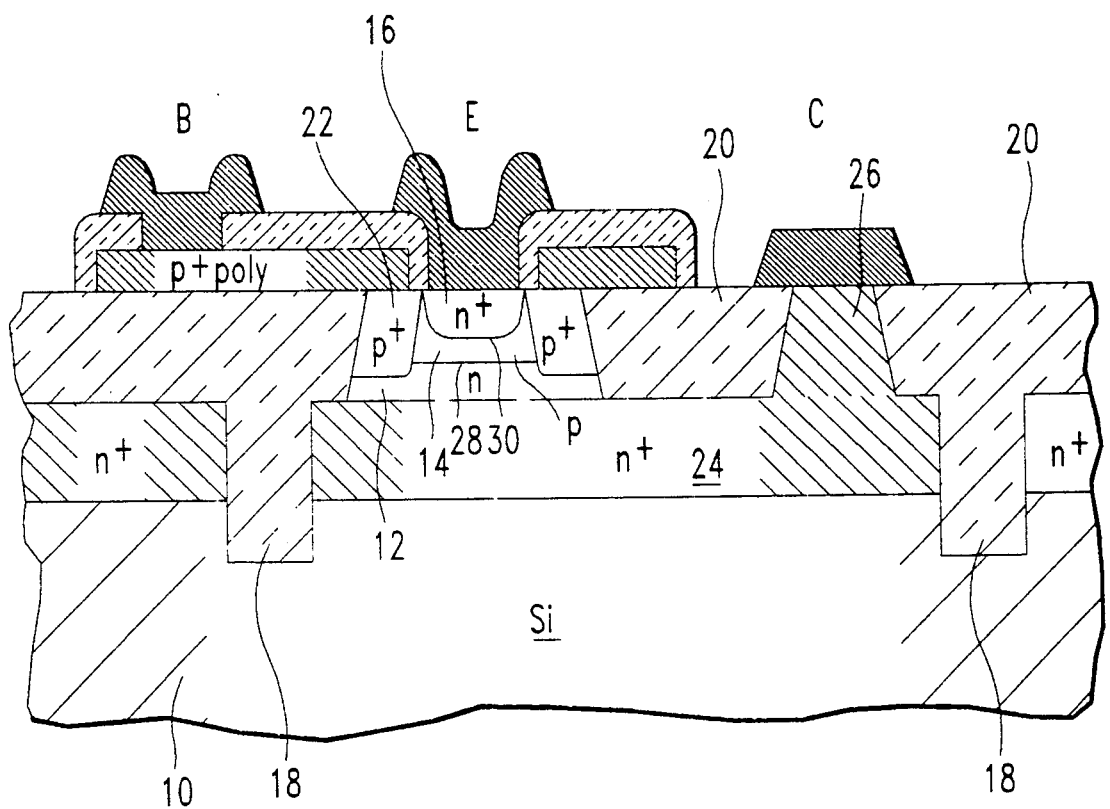
FIG. 1 shows a cross section of a typical vertical bipolar transistor from prior art.
Figure 2:
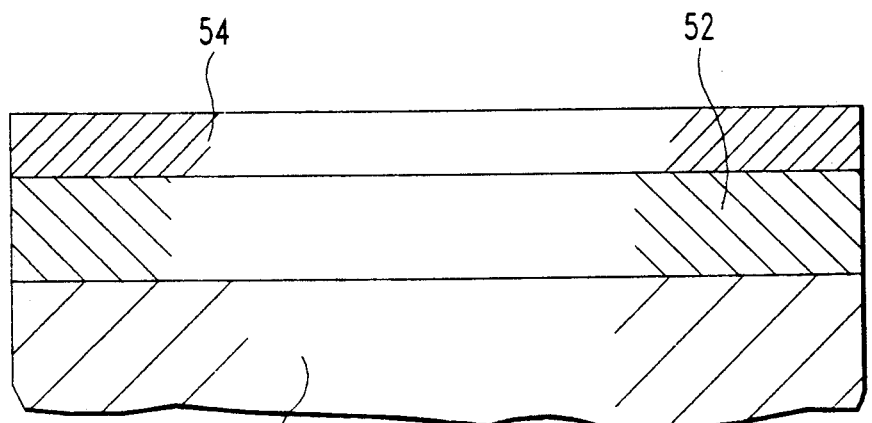
FIGS. 2 to 9 show cross sections of a bipolar transistor at various points of processing using the embodiments of the present invention.

Referring to FIG. 2, a layer 52, highly doped with impurities of a first conductivity, is deposited on a substrate 50, by known epitaxial techniques and doped by diffusion drive-in from a source layer or by implantation. In a bipolar device, the layer 52 is referred to as the sub-collector sometimes. Another layer 54, lightly doped with impurities of the first conductivity type, is deposited on layer 52, by use of epitaxial deposition. This layer is used as the collector region of the transistor. The impurities used for doping the collector region is boron for the case of a PNP transistor and is either As, P or Sb in the case of an NPN transistor. As such in the following discussions, when boron is chosen as the impurity of first conductivity, As, P and Sb are automatically referred to as the impurity of the second conductivity and vice versa.

Figure 3:
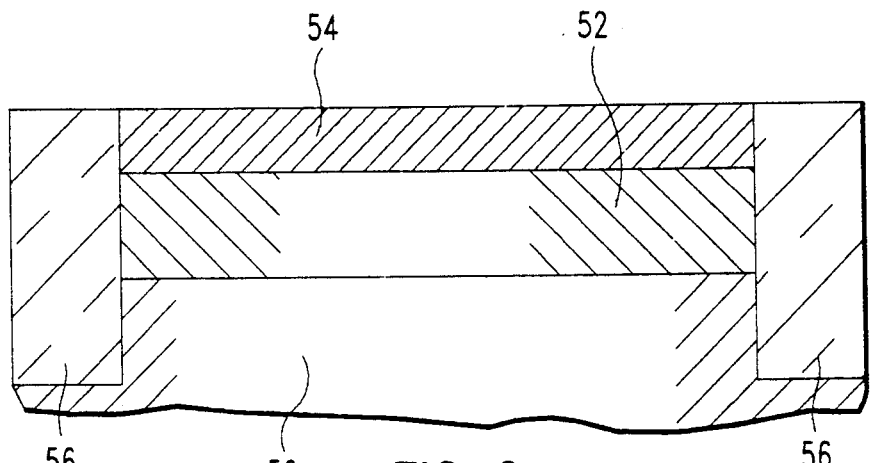

Now referring to FIG. 3, a deep trench region 56 is formed by reactive ion etching deep grooves completely through the layers 54 and 52 and partly into the substrate 50. The grooves are subsequently lined with an insulator to electrically isolate the regions inside of the trench from regions outside of the trench. Depending on the design, some of the deep trenches are entirely filled with an insulator, and some are lined with an insulator and filled with polysilicon.

Figure 4:
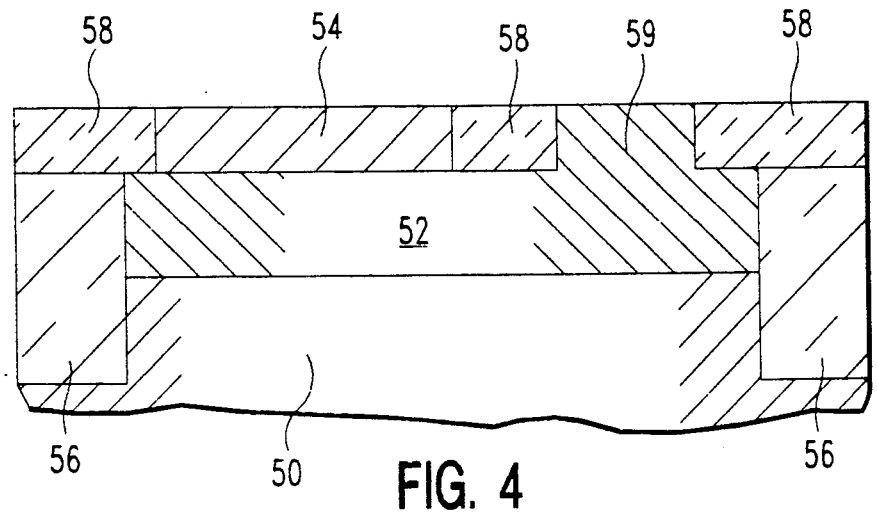

Now referring to FIG. 4, shallow trench isolation regions 58 are formed, by reactive ion etching grooves through layer 54. The shallow trenches are filled with insulating material, the trench surrounds regions for forming the vertical transistor structure. Alternatively, the shallow trench isolation can be replaced by recessed oxide isolation, by selectively oxidizing the regions corresponding to the shallow trench. FIG. 4 also shows a region 59, which has also been highly doped with impurities of the first conductivity type, which makes a lower resistance electrical path to layer 52. This region 59 is referred to as a "reach-through contact to the sub-collector layer 52, in the bipolar device.

Figure 5:
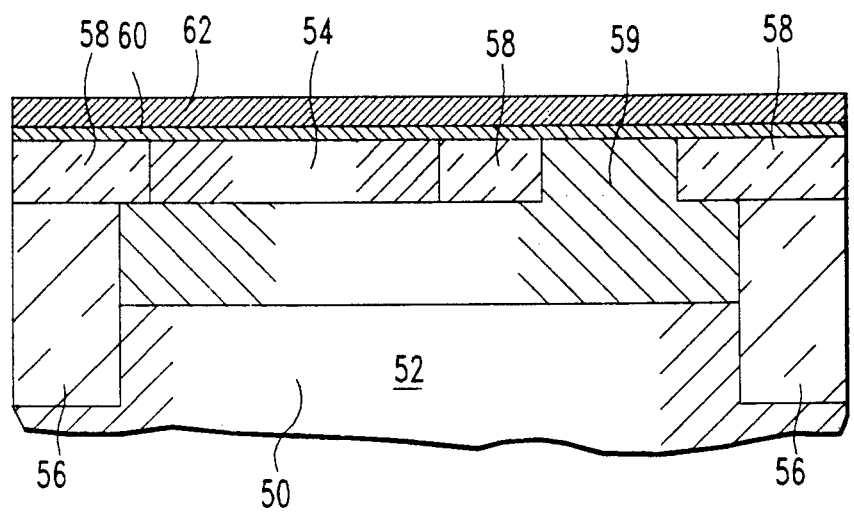

Referring to FIG. 5, layer 60 is deposited by epitaxial deposition under conditions of low temperature, high vacuum etc. over the entire silicon substrate surface, in contact with a variety of regions. This layer 60 is doped with impurities of a second type conductivity and is called a base layer in bipolar devices. This layer is silicon (homojunction) or Si-Ge (heterojunction). As discussed in the background art, the speed of the device is largely influenced by how well the thickness can be controlled to a minimum. The base layer doping is achieved preferably by in-situ doping but can also be achieved by ion implantation. The polysilicon layer 62 is deposited over the single crystal base layer 60. Polysilicon layer 62 is used to provide a low resistive path to contact the base region of the transistor device. The polysilicon layer is doped in-situ or by implantation with impurity of the same conductivity as the base layer.

Figure 6:
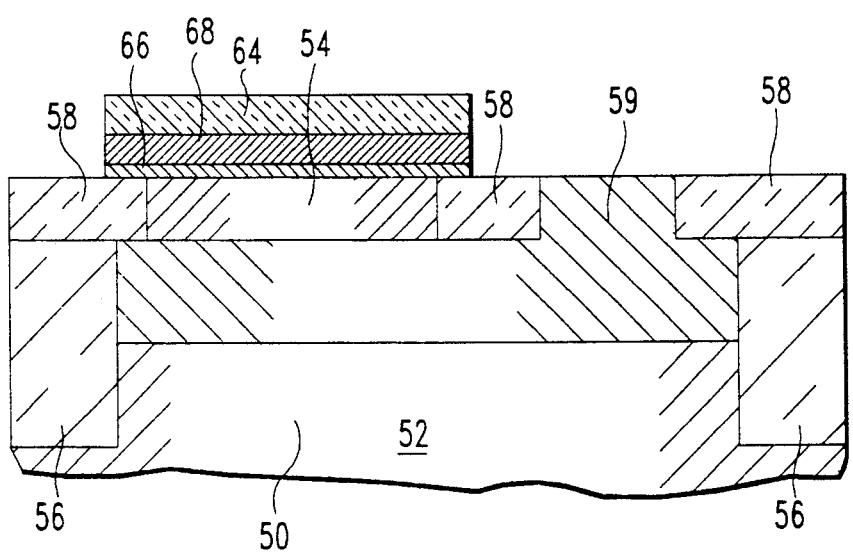

Referring to FIG. 6, a blanket layer of electrically insulating material is deposited over layer 62 (not shown) and the stacked layers of base Si, base polysilicon and the insulator are etched by use of resist patterning (not shown) and etching to provide the resultant features 64, 66 and 68 as shown.

Figure 7:
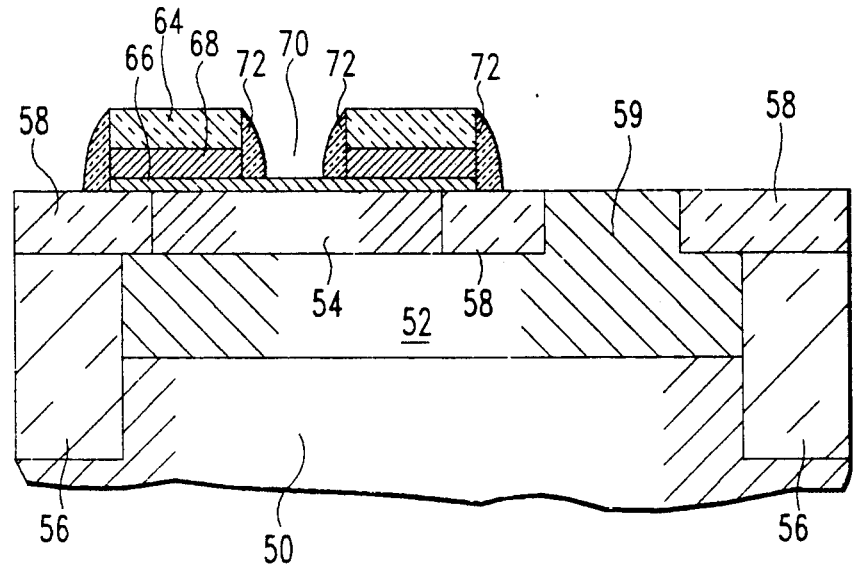

Now referring to FIG. 7, opening 70, the emitter window is opened by resist patterning and reactive ion etching (not shown). Opening 70 is an important feature as it is utilized to form the self aligned bipolar device. Sidewall insulating spacers 72 are formed by established processes of conformal deposition and reactive ion etch. At this point, the base surface is cleaned of any oxides or other unwanted residues by suitable wet etching.

Figure 8:
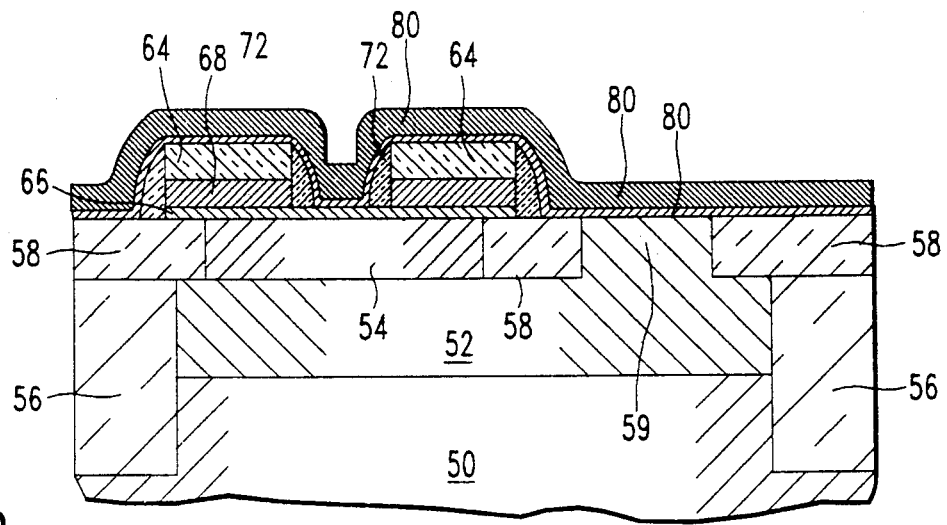

Referring to FIG. 8, layer 74, amorphous Si is deposited using low temperature CVD process and the layer is doped in-situ with P or As in the case of N type emitter (impurity of first conductivity type) and B in the case of P type emitter. The deposition is preferably done below 600° C. In the temperature range of 400° C. to 600° C., and with an in-situ cleaning step prior to deposition to remove the native oxide. This thickness is chosen to be in the range of 20 to 50 nanometers (nm) for reasons that will become apparent later on. This layer is cladded with a layer of polysilicon 76 doped with the same first conductivity type impurities. The layer 76 is chosen to be in the thickness range of 100 to 200 nm. This deposition is also done at low temperature, preferably about 600° C., similar to the layer 74. In a preferred approach both these layers are deposited sequentially in the same CVD reactor. In some instances, layer 74 is heated to a temperature range of 550° C. 650° C. for 30 to 60 minutes in nitrogen ambient or vacuum, for densifying the amorphous Si and also to reduce the amount of hydrogen in the amorphous Si. This thermal treatment is usually done in nitrogen gas ambient or in vacuum before layer 76 is deposited. The layers 74 and 76 are deposited usually by chemical vapor deposition (CVD) in the temperature range of 450°-600° C., using reactant gases consisting of a Si source gas, a dopant source gas and possibly a diluent such as hydrogen or argon at a total pressure of 0.02 to 760 torr. The Si source gas is selected from silane, dichloro-silane, disilane and chloro-silane. The dopant source gas is selected from arsine, phosphine, tertiary butyl arsine and tertiary butyl phosphine.

Figure 9:
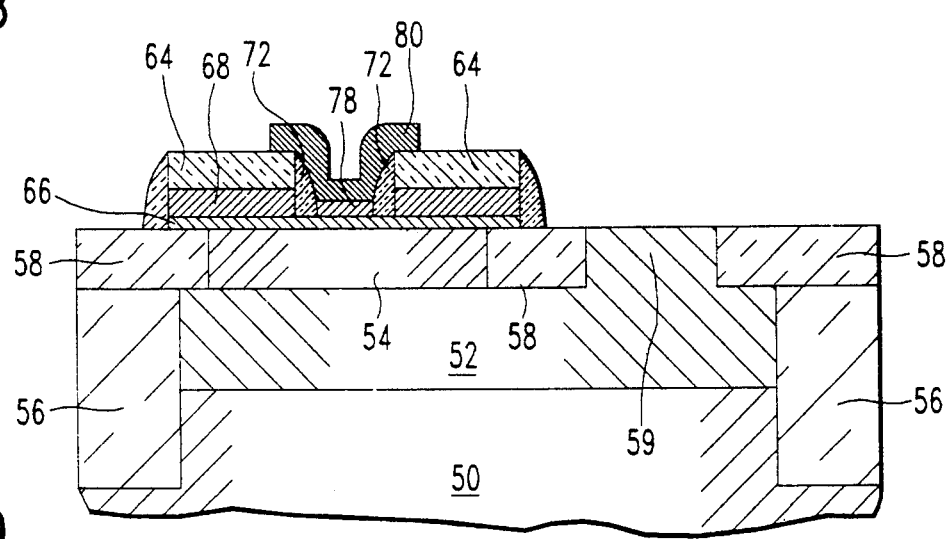

Referring to FIG. 9, the layers 74 and 76 have now been patterned by photoresist and rective ion etching (not shown) so that the emitter contact is covered by these layers. Subsequently, a prolonged heating is performed at about 600°-650° C. for several hours, usually in the range of 4 to 8 hours, which converts the layer 74 into monocrystalline region 78 where it is in contact with the single crystal base region, by solid phase epitaxy (SPE) and to polycrystalline the remaining layer 74. The interface between the layer 78 and the base region is well formed without voids and dislocations, because the chosen thickness for the amorphous silicon layer is small (less than 500 Å). A thicker layer of amorphous Si when converted by solid phase epitaxy does not produce such a good interface, because of difficulty in removing the hydrogen completely from the layer prior to SPE. Use of thin amorphous Si layer also establishes good electrical contact between layer 78, which will be referred to as emitter single crystal layer and the base layer 66. Because of the in-situ doping, a very brief high temperature anneal of 900° C. to 1100° C. for 10 to 30 seconds is sufficient to activate the dopants without affecting the diffusion profiles (junctions). A preferred choice for this anneal is rapid thermal anneal (RTA), which uses a flash lamp to heat the substrate quickly. The emitter-base junction is defined by the geometrical interface of the amorphous Si layer and the single crystal base layer very precisely. The formation of emitter-base junctions into the base layer, as the case in other references by high temperature diffusion is totally avoided. The base width is exclusively controlled by the base epitaxy deposition, and the base-collector junction and the base-emitter junction are precisely defined by deposition boundaries, rather by diffusion profiles. Thus using this method, very thin bases can be obtained and also very good base-emitter interfaces obtained. In addition because of the low temperature/low thickness of the amorphous layer, this process is compatible with both homojunction and heterojunction transistors.

Figure 10:
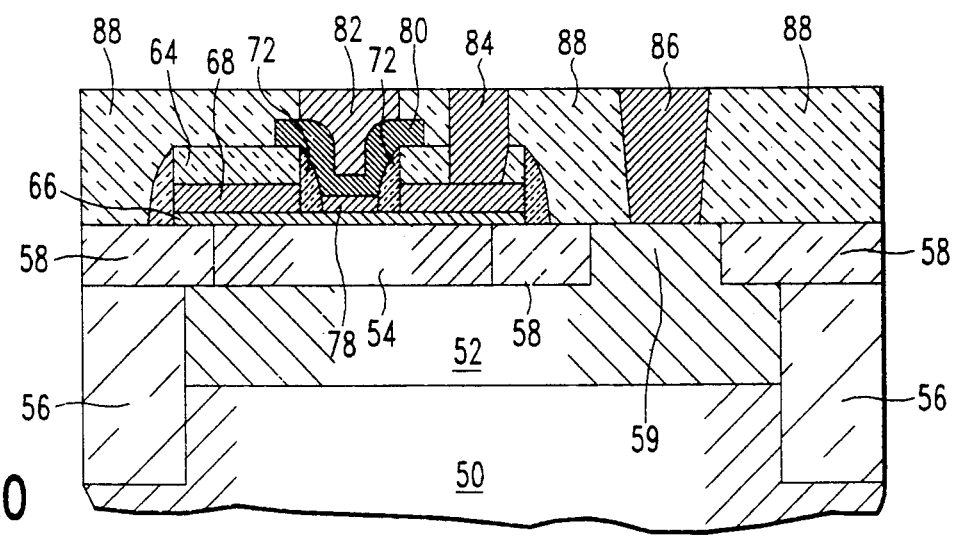
FIG. 10 shows the cross section of a completed bipolar transistor using the method of the present invention.

Referring to FIG. 10, the layer 88 is a thick insulating layer which has been deposited and smoothened or planarized. This insulator is usually plasma deposited silicon oxide, sometimes doped with P and or B. FIG. 10 also shows that electrically conducting contacts 82, 84 and 86 have been formed to the emitter polysilicon, the extrinsic base polysilicon and to the reach-through collector regions.

In all above discussions, if the impurity of the first conductivity type is As, Sb or P, and the second conductivity type is Boron, then the resultant transistor is an NPN bipolar device. When the impurity of the first conductivity type is Boron, then the resultant transistor is a PNP bipolar device.

There is thus provided a method to form a bipolar transistor, with a very thin base and a sharply defined base-emitter junction. The emitter-base interface is of high quality with low electrical resistance. The processes do not alter the established diffusion profiles. The in-situ doping allows for achieving high impurity concentration in the emitter layer. The low temperature processes allow for defining the junction by the interface of deposited layers. The present invention has great utility in semiconductor device fabrication and particularly in the formation of high speed, high gain vertical bipolar transistors.

While the invention has been described in terms of a single preferred embodiment, various alternatives and modifications can be devised by those skilled in the art without departing from the invention. Accordingly, the present invention is intended to embrace all such alternatives which fall within the scope of the appended claims.

What is claimed is:

1. A method of fabricating a bipolar transistor comprising the steps of:

providing a semiconductor substrate including a collector region of a first conductivity type and a base region of a second conductivity type formed over said collector region;

forming a layer of amorphous silicon in-situ doped to said first conductivity type over said base region;

heating said amorphous silicon at a temperature of less than about 650 degrees centigrade so as to densify said layer;

forming a layer of polycrystalline Si, doped to said first conductivity type over said amorphous Si layer; and, further heating said amorphous Si and polycrystalline Si layers to a temperature below 600 degrees centigrade to at least partially recrystallize the amorphous Si layer into monocrystalline emitter region on said base region.

2. A method in accordance with claim 1 wherein said step of forming said layer of amorphous semiconductor material includes depositing said layer by chemical vapor deposition.

3. A method in accordance with claim 2 wherein said chemical vapor deposition comprises heating said Si wafers to a temperature of 450-600 degrees centigrade; flowing reactant gases consisting of a Si source gas, and a dopant source gas with total flow rates in the range of 0.025 to 1 sccm; and to a total pressure of 0.02 to 760 torr.

4. A method in accordance with claim 3, wherein said Si source gas is selected from a group consisting of silane, disilane, chlorosilane and dichlorosilane and said dopant source gas is selected from a group consisting of arsine, phosphine, tertiarybutyl arsine and tertiarybutyl phosphine.

5. A method in accordance with claim 1 wherein said heating step includes heating said amorphous semiconductor material at a temperature in the range of 550-650 degrees centigrade for a period of time of about 10 to 60 minutes and in a vacuum.

6. A method in accordance with claim 1 and further including the step of cleaning the surface of said base region before forming said layer of amorphous semiconductor material whereby to remove any native oxide on the surface of said base region.

7. A method in accordance with claim 1, wherein said amorphous Si layer thickness is greater than 20 nm, but less than 50 nm.

8. A method in accordance with claim 1, wherein said polysilicon thickness is in the range of 100 to 200 nm.

9. A method in accordance with claim 1, wherein said amorphous Si deposition, said heating for densificiation and said polysilicon deposition is done sequentially in the same CVD reactor.

10. A method in accordance with claim 1, wherein said furnace annealing for solid phase epitaxy is done in the temperature range of 600 to 700 degrees centigrade for 4 to 6 hours, the preferred conditions being at 650 degrees centigrade for 5 hours.

11. A method in accordance with claim 1, wherein said heating by RTA is at about 950 degrees centigrade for 20 seconds.

12. A method in accordance with claim 1, wherein said polysilicon layer is in-situ doped with impurities of first conductivity type.

13. A method in accordance with claim 1, wherein the dopant of said first conductivity type is selected from the group consisting essentially of As, P, Sb and the dopants of said second conductivity type is Boron.

14. A method in accordance with claim 1, wherein the dopant of the first conductivity type is Boron and, the dopant of the second conductivity type is selected from a group consisting of As, P and Sb.

* * * * *